United States Patent [19]

Holloman et al.

[11] Patent Number: 4,976,789
[45] Date of Patent: Dec. 11, 1990

[54] POWER TRANSMISSION DEVICE

[75] Inventors: Miles E. Holloman, Decatur; Debbee J. Jordan; William F. Otto, both of Huntsville, all of Ala.

[73] Assignee: The United States of America as represented by the Secretary of the Army, Washington, D.C.

[21] Appl. No.: 456,899

[22] Filed: Dec. 26, 1989

[51] Int. Cl.$^5$ .............................................. H01L 31/052
[52] U.S. Cl. ..................................... 136/246; 136/292; 250/227.11
[58] Field of Search ............................... 136/246, 292; 250/227.11

[56] References Cited

U.S. PATENT DOCUMENTS

| | | | |
|---|---|---|---|
| 3,379,394 | 4/1968 | Bialy | 244/173 |
| 3,490,950 | 1/1970 | Myer | 136/246 |
| 4,001,704 | 1/1977 | Danielmeyer et al. | 330/4.3 |
| 4,003,756 | 1/1977 | Abrams | 136/246 |
| 4,529,830 | 7/1985 | Daniel | 136/246 |
| 4,695,120 | 9/1987 | Holder | 350/96.11 |

FOREIGN PATENT DOCUMENTS

| | | | |
|---|---|---|---|
| 57-93583 | 6/1982 | Japan | 136/246 |
| 59-126681 | 7/1984 | Japan | 136/246 |
| 61-231773 | 10/1986 | Japan | 136/246 |

Primary Examiner—Aaron Weisstuch
Attorney, Agent, or Firm—Freddie M. Bush; Howard G. Garner

[57] ABSTRACT

A power transmission device for transmitting electric power optically to remote locations. The device includes a laser for generating a laser light beam and a optical glass monofilament having a glass core and a outer cladding layer designed to convey the light beams directed into one end of said monofilament to the other end thereof. Means are provided for directing the laser beam into the receiving end of the monofilament at a predetermined angle which causes the light beam to exit from the other end of the monofilament at the base predetermined angle in a conical annulus of light. A conical reflector is disposed within the conical annulus of light exiting from the exit end of the fiber optical monofilament and has a surface that intercepts the light beams within the conical annulus and reflects them along a different path. Disposed around the conical reflector is a plurality of photovoltaic cells in a position to intercept the reflected light beams and to convert the light beams to electric current. The photovoltaic cells are connected in series to increase the amount of voltage produced by the transmission device.

9 Claims, 3 Drawing Sheets

POWER TRANSMISSION DEVICE

DEDICATORY CLAUSE

The invention described herein may be manufactured, used, and licensed by or for the Government for governmental purposes without the payment to us of any royalties thereon.

BACKGROUND OF INVENTION

This invention relates to a device for providing electric power to remote locations. More particularly, this invention relates to a device for providing electric power in a remote location where electric wires would disturb balance within a electro-magnetic environment and where batteries are not adequate. In testing missile telemetry packages, it is necessary to provide a source of electricity to test the reaction of various devices to electromagnetic fields. In this environment, any conductive cables would change the field and would, therefore, not give accurate test results.

SUMMARY OF THE INVENTION

It is an object of the invention to provide a device for delivering electric power to a remote location for testing devices' reactions to electromagnetic fields without disturbing the electromagnetic fields.

An alternative to batteries for delivering power to such devices is to utilize a fiber optic filament to direct light to photovoltaic cells located within the missile that is in the electro-magnetic environment. In this system photovoltaic cells convert the optical power into electrical power. Photovoltaic cells typically provide voltages in the range of 0.5 to 1.0 volts. Where a higher voltage is required a plurality of photovaltic cells are connected in series. However, in connecting the cells in series it becomes difficult to distribute the light from the optical filament equally or uniformly to all of the cells. If the light is not distributed equally, and one or more cells do not receive the same optical power as the other cells, these cells will not produce as high a current as the others. This means that the cell receiving the least optical power will set the current limit for all of the cells since they are connected in series. Thus, an unequal distribution of light causes a loss in the overall efficiency of all the cells.

The invention provides a means to equally distribute optical energy by optical filament to a plurality of series-connected photovoltaic cells in order to produce the required voltage in locations which are compact and in restricted space locations.

In the invention a laser beam of light is directed into a receiving end of a glass optical monofilament at an angle to its longitudinal axis and the beam exits from the other end of the optical monofilament in a conical annulus of light having the same angle as the angle at which the light was directed into the optical monofilament. Means are provided to intercept the conical annulus of light and to direct it uniformly upon a plurality of series connected photovoltaic cells to generate the required electric power.

DETAILED DESCRIPTION OF THE INVENTION

Figure 1:
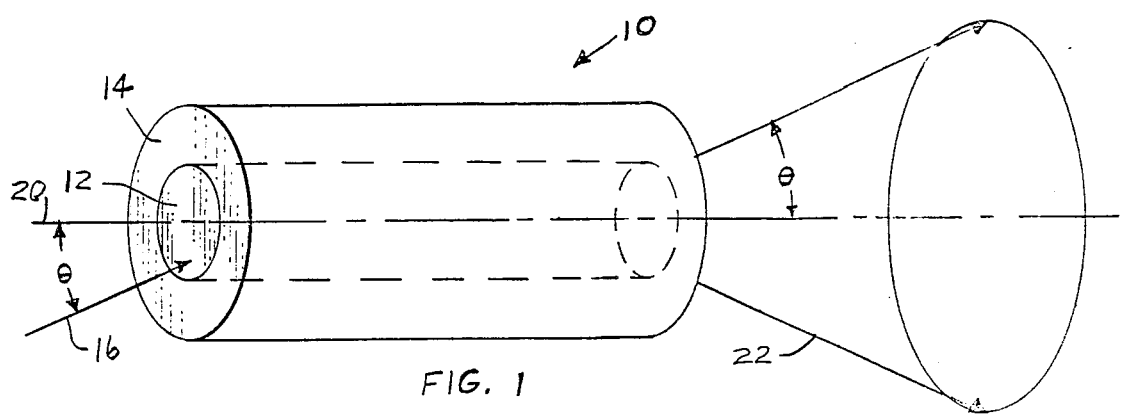
FIG. 1 is a perspective view of an optical glass monofilament showing the transmittal of a laser beam through the filament.

Referring now to FIG. 1 which shows a fiber optic monofilament 10, which has a glass core 12 and a counter cladding 14 of glass to permit monofilament 10 to transmit light beams from one end to the other end. At one end of monofilament 10 a laser beam 16 from laser 15 (see FIG. 5) is directed into the core of the monofilament 10 at an angle $\theta$ to the longitudinal axis 20 of monofilament 10. Laser beam 16 is transmitted from one end of monofilament 10 to the other end and exits from the other end of the monofilament in the form of a conical annulus 22 having a conical angle to the longitudinal axis 20 of the monofilament. It should be noted this angle is always the same as the angle at which laser beam 16 entered the core of the monofilament. Furthermore, the light beam exits from the end of the monofilament in a conical annulus 22, with the light beam 16 evenly distributed throughout the annulus 22.

Figure 2:
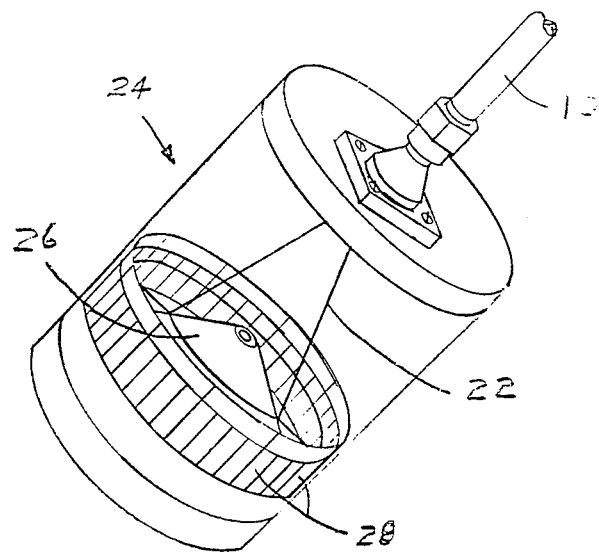
FIG. 2 is a perspective view of the light receiving and electricity generating device of the invention.

In FIG. 2 is shown a power converter 24 which comprises a conical reflector 26, centrally disposed within a ring of solar cells 28. Solar cells 28 are photovoltaic and convert light shining upon them into electrical current. The solar cells 28 are held in place by a bonding agent 29, as seen best in FIG. 4.

Figure 3:
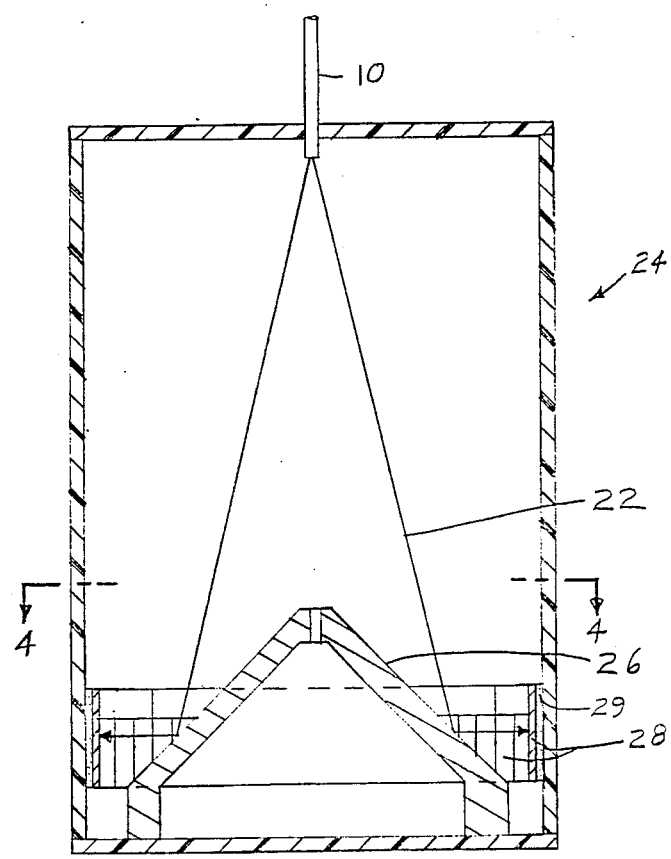
FIG. 3 is a sectional side view of the light receiver and power generating device illustrated in FIG. 2.
Figure 4:
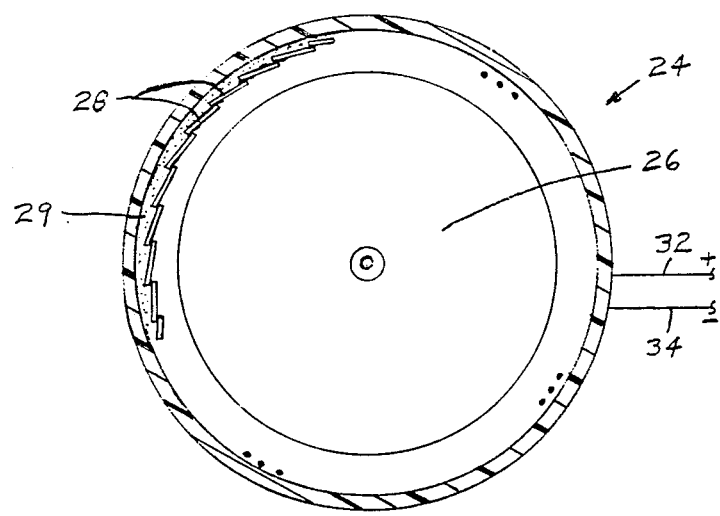
FIG. 4 is a sectional plan view taken along line 4—4 of FIG. 3.

Referring now to FIGS. 3 and 4 wherein it is seen that conical reflector 26 has its apex disposed within conical annulus 22 and its base disposed outside of the annulus in a position to intercept and reflect the light beams disposed in conical annulus 22. Light beams in conical annulus 22 are reflected by the conical reflector 26 to impinge evenly upon the surfaces of solar cells 28. Since the laser beam is evenly distributed within conical annulus 22, its light is evenly reflected upon the cells 28 to provide an even distribution of the light beams thereon and, to provide an even power generation throughout all of the solar cells 28.

As can be seen best in FIG. 4, solar cells 28 are arranged in overlapping relationship with each other, so as to provide an even disposition of the solar cells within the power converter 24. Solar cells 28 are held in place by a bonding agent 29 which is selected to withstand any heat that may be generated within the solar cells 28.

Figure 5:
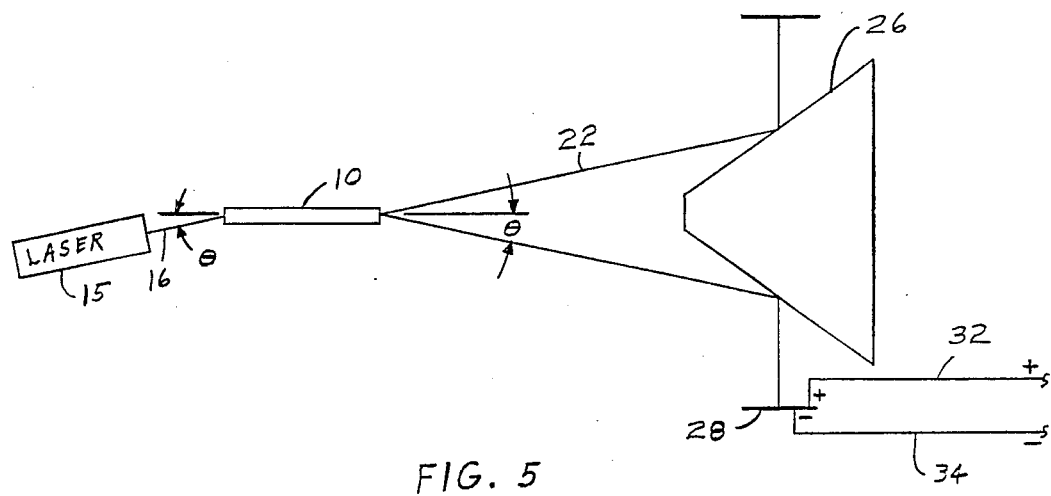
FIG. 5 is a schematic view of the apparatus of the invention.
Figure 6:
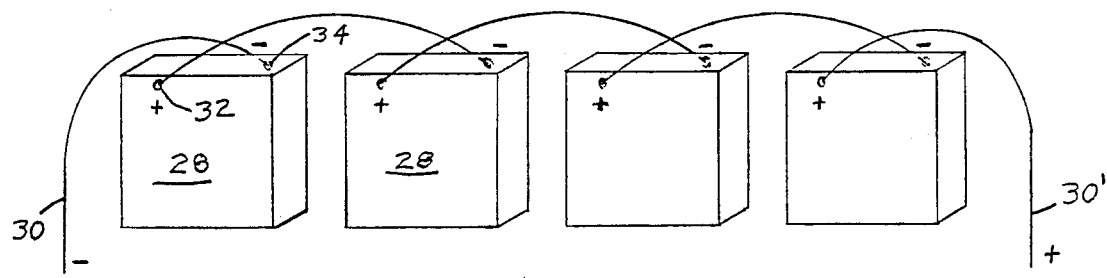
FIG. 6 is a perspective view of the photovoltaic cells of the invention wired in series.

As seen best in FIGS. 5 and 6, the light beams in annulus 22 are reflected onto cells 28, which are wired in series, with the front of each of the cells having a positive contact 32 which is connected by wire to the back side of the adjacent solar cell 28 as at 34. Since each of the cells 28 generate a small voltage and current the plurality of cells will produce an additive or higher voltage available at output terminals 30 and 30' whenever the photovoltaic cells are connected in series as illustrated in FIG. 6.

However, where photovoltaic cells are connected in series as illustrated it is very important that each of the cells receive the same amount of light as do the remaining cells. If the cells do not receive the same amount of light, the cell receiving the least optical power will set the current limit for all the cells when they are connected in series. Such uneven distribution of light causes a loss of efficiency of the cells in producing electrical current.

We claim:

1. A power transmission device for transmitting electrical power optically, comprising:
   (a) a laser for generating a laser light beam;
   (b) an optical glass monofilament having a glass core with a predetermined refractive index and a cladding outer layer having a different refractive index for conveying light beams;
   (c) means for directing said laser beam into a receiving end of said monofilament at a predetermined angle to longitudinal axis of said monofilament, whereby said laser beam is transmitted to an exit of said monofilament, exits therefrom in a uniform conical annulus at the same angle to the longitudinal axis of said monofilament as said laser beam was directed into said receiving end;
   (d) a conical reflector disposed with its apex inside of said conical annulus and with its base disposed outside of said conical annulus to intercept and reflect light beams in said conical annulus along a path outwardly of said reflector at an angle to the longitudinal axis of said conical reflector; and
   (e) a plurality of photovoltaic cells disposed in a ring about said conical reflector, having inner surfaces extending in a path to intercept said reflected light beams uniformly to generate electric current therefrom.

2. A power transmission device as set forth in claim 1, wherein said photovoltaic cells are flat and overlap the inner surface of adjacent cells so as to provide evenly spaced surfaces for evenly receiving said reflected light beams from said conical reflector.

3. A power transmission device as set forth in claim 1, wherein said photovaltic cells are connected in series to produce a predetermined amount of electrical power which is greater than that produced by individual cells.

4. A power transmission device as set forth in claim 1, wherein said conical reflector reflects the light beams in said annulus along a path which is substantially at right angles to the longitudinal axis of said conical reflector.

5. A power transmission device as set forth in claim 1, wherein the inner surfaces of said photovoltaic cells are disposed to intercept said reflected light beams at substantially right angles to the longitudinal axis of the center of said reflected beams.

6. A power transmission device for transmitting electric power optically, comprising:
   (a) a laser for generating a laser light beam;
   (b) an optical glass monofilament having a glass core with a predetermined refractive index and a cladding outer layer having a different refractive index for conveying light beams;
   (c) means for directing said laser beam into a receiving end of said monofilament at a predetermined angle to the longitudinal axis of said monofilament at a predetermined angle to the longitudinal to an exit end of said monofilament, and exits therefrom in a uniform conical annulus at the same angle to the longitudinal axis of said moniflament as said laser beam was directed into said receiving end of said monofilament;
   (d) a conical reflector disposed with a portion of its surface inside of said conical annulus and extending at an angle so as to intercept and reflect light beams in said conical annulus along a path outwardly of said reflector at substantially right angles to the longitudinal axis of said conical reflector; and
   (e) a plurality of photovoltaic cells disposed around said conical reflector having inner surfaces extending substantially parallel to the longitudinal axis of said conical reflector, in a path to intercept said reflected light beams uniformly to generate electrical current.

7. A power transmission device as set forth in claim 6, wherein said photovoltaic cells are flat and overlap the inner surface of adjacent cells so as to provide evenly spaced surfaces for evenly receiving said reflected light beams from said conical reflector.

8. A power transmission device as set forth in claim 6, wherein said photovoltaic cells are connected in series to produce a predetermined amount of electrical power which is greater than that produced by individual cells.

9. A power transmission device as set forth in claim 6, wherein the inner surfaces of said photovoltaic cells are disposed to intercept said reflected light beams at substantially right angles to the longitudinal axis of the center of said reflected beams.

* * * * *

UNITED STATES PATENT AND TRADEMARK OFFICE
CERTIFICATE OF CORRECTION

PATENT NO. : 4,976,789

DATED : December 11, 1990

INVENTOR(S) : Miles E. Holloman et al

It is certified that error appears in the above—identified patent and that said Letters Patent is hereby corrected as shown below:

Column 2, line 16: "counter" should read - - - outer - - -.

Column 3, line 19: after "exit" insert - - - end - - -.

Column 4, line 16: delete "at a predetermined angle to the longitudinal and substitute therefor - - - whereby said laser beam is transmitted ---.

Signed and Sealed this

Seventh Day of April, 1992

Attest:

HARRY F. MANBECK, JR.

*Attesting Officer*   *Commissioner of Patents and Trademarks*